United States Patent
Fraga et al.

(10) Patent No.: US 10,229,661 B2
(45) Date of Patent: Mar. 12, 2019

(54) ADAPTIVE MUSIC PLAYBACK SYSTEM

(71) Applicant: NIKE, Inc., Beaverton, OR (US)

(72) Inventors: Justin Fraga, Portland, OR (US); Levi J. Patton, Portland, OR (US)

(73) Assignee: NIKE, Inc., Beaverton, OR (US)

( * ) Notice: Subject to any disclaimer, the term of this patent is extended or adjusted under 35 U.S.C. 154(b) by 0 days.

(21) Appl. No.: 15/416,689

(22) Filed: Jan. 26, 2017

(65) Prior Publication Data

US 2017/0148425 A1    May 25, 2017

Related U.S. Application Data

(63) Continuation of application No. 13/941,633, filed on Jul. 15, 2013, now Pat. No. 9,595,932.

(60) Provisional application No. 61/772,640, filed on Mar. 5, 2013.

(51) Int. Cl.
| | | |
|---|---|---|
| G06F 17/00 | (2006.01) | |
| G10H 1/00 | (2006.01) | |
| H03G 3/20 | (2006.01) | |
| G06F 17/30 | (2006.01) | |
| G10H 1/46 | (2006.01) | |

(52) U.S. Cl.
CPC ..... *G10H 1/0025* (2013.01); *G06F 17/30743* (2013.01); *G10H 1/00* (2013.01); *G10H 1/46* (2013.01); *H03G 3/20* (2013.01); *G10H 2210/031* (2013.01); *G10H 2210/101* (2013.01); *G10H 2210/125* (2013.01); *G10H 2210/136* (2013.01); *G10H 2210/145* (2013.01); *G10H 2220/201* (2013.01); *G10H 2220/371* (2013.01); *G10H 2240/085* (2013.01); *G10H 2240/131* (2013.01); *G10H 2250/035* (2013.01)

(58) Field of Classification Search
CPC ..................................................... G06F 3/165
See application file for complete search history.

(56) References Cited

U.S. PATENT DOCUMENTS

| | | |
|---|---|---|
| 6,746,247 B2 | 6/2004 | Barton |
| 7,428,471 B2 | 9/2008 | Darley et al. |
| 7,674,967 B2 | 3/2010 | Makino |
| 7,700,867 B2 | 4/2010 | Sano et al. |
| 7,732,700 B2 | 6/2010 | Terauchi et al. |
| 7,745,716 B1 | 6/2010 | Murphy |
| 7,771,320 B2 | 8/2010 | Riley et al. |

(Continued)

FOREIGN PATENT DOCUMENTS

| | | |
|---|---|---|
| JP | 2006098478 A | 4/2006 |
| JP | 2006-251023 A | 9/2006 |

(Continued)

OTHER PUBLICATIONS

Sandor Dornbush et al: "XPod: A Human Activity Aware Learning Mobile Music Player", Second IEE Mobility Conference on Mobile Technology, Applications and Systems, Nov. 15, 2005, pp. 1-5.

(Continued)

*Primary Examiner* — Joseph Saunders, Jr.
(74) *Attorney, Agent, or Firm* — Banner & Witcoff, Ltd.

(57) ABSTRACT

An adaptive music playback system is disclosed. The system includes a composition system that receives information corresponding to user activity levels. The composition system modifies the composition of a song in response to changes in user activity. The modifications are made according to a set of composition rules to facilitate smooth musical transitions.

20 Claims, 16 Drawing Sheets

(56) References Cited

U.S. PATENT DOCUMENTS

| | | |
|---|---|---|
| 7,790,976 B2 | 9/2010 | Takai et al. |
| 8,086,421 B2 | 12/2011 | Case, Jr. et al. |
| 8,112,251 B2 | 2/2012 | Case, Jr. et al. |
| 2007/0021269 A1 | 1/2007 | Shum |
| 2007/0074617 A1 | 4/2007 | Vergo |
| 2007/0074619 A1 | 4/2007 | Vergo |
| 2007/0154872 A1 | 7/2007 | Sako et al. |
| 2007/0261538 A1 | 11/2007 | Takai et al. |
| 2008/0103022 A1 | 5/2008 | Dvorak et al. |
| 2008/0188354 A1 | 8/2008 | Pauws et al. |
| 2008/0202323 A1 | 8/2008 | Isozaki et al. |
| 2008/0223196 A1 | 9/2008 | Nakamura et al. |
| 2008/0236370 A1 | 10/2008 | Sasaki et al. |
| 2008/0257133 A1 | 10/2008 | Sasaki et al. |
| 2009/0003802 A1 | 1/2009 | Takai et al. |
| 2009/0044687 A1 | 2/2009 | Sorber |
| 2009/0097689 A1 | 4/2009 | Prest et al. |
| 2009/0144080 A1 | 6/2009 | Gray et al. |
| 2009/0260506 A1 | 10/2009 | Saperston |
| 2010/0063778 A1 | 3/2010 | Schrock et al. |
| 2010/0186578 A1 | 7/2010 | Bowen |
| 2010/0273610 A1 | 10/2010 | Johnson |
| 2011/0032105 A1 | 2/2011 | Hoffman et al. |
| 2011/0199393 A1 | 8/2011 | Nurse et al. |
| 2012/0078396 A1 | 3/2012 | Case, Jr. et al. |
| 2012/0214587 A1 | 8/2012 | Segal |
| 2012/0234111 A1 | 9/2012 | Molyneux et al. |
| 2012/0251079 A1 | 10/2012 | Meschter et al. |
| 2012/0291563 A1 | 11/2012 | Schrock et al. |
| 2012/0291564 A1 | 11/2012 | Amos et al. |
| 2013/0213144 A1 | 8/2013 | Rice et al. |
| 2013/0213147 A1 | 8/2013 | Rice et al. |

FOREIGN PATENT DOCUMENTS

| | | |
|---|---|---|
| JP | 2008242037 A | 10/2008 |
| JP | 2008242064 A | 10/2008 |
| JP | 2008242288 A | 10/2008 |
| JP | 2009-031361 A | 2/2009 |
| JP | 2010192012 A | 9/2010 |
| KR | 20070068372 A | 6/2007 |
| WO | 2010041147 A2 | 4/2010 |

OTHER PUBLICATIONS

Feb. 4, 2014—(WO) ISR and WO—App. No. PCT/US2013/051467.

ADAPTIVE MUSIC PLAYBACK SYSTEM

CROSS-REFERENCE TO RELATED APPLICATIONS

The present application claims the benefit of and is a continuation of U.S. patent application Ser. No. 13/941,633 filed Jul. 15, 2013, which claims the benefit of U.S. Provisional Patent Application No. 61/772,640, filed Mar. 5, 2013, and titled "Adaptive Music Playback System." The contents of the above noted applications are incorporated by reference herein in their entirety.

BACKGROUND

The present embodiments relate generally to systems and methods for playing audio information.

Systems for playing audio information are known in the art. Some such systems are portable and may be used by athletes during a workout. Examples of such systems are portable digital audio players as well as mobile phones that include music playback features. Some systems may further incorporate features to facilitate activities, for example software to map a user's run using GPS information.

SUMMARY

In one aspect, a method of adjusting the playback of audio information includes playing a set of audio tracks, retrieving a set of composition rules and receiving user activity information from at least one sensor configured to detect movements of a user and determining a user activity level from the user activity information. The method also includes determining a target song intensity corresponding to the user activity level and controlling the set of audio tracks to achieve the target song intensity.

In another aspect, a method of adjusting the playback of audio information includes playing a song, the song including a plurality of song segments that are sequential in time and the song further comprising a set of audio tracks that may be played simultaneously. The method further includes retrieving a set of composition rules, receiving user activity information from at least one sensor configured to detect movements of a user and determining a user activity level from the user activity information while a first song segment is being played. The method also includes finding a second song segment with a song state that matches the user activity level using the composition rules to compose a musical transition from the first song segment to the second song segment.

In another aspect, a method of adjusting the playback of audio information includes playing a song, the song including a plurality of song segments that are sequential in time. The method also includes receiving user activity information from at least one sensor configured to detect movements of a user and determining a user activity level from the user activity information while a first song segment is being played. The method also includes finding a second segment of the song with a song state that matches the user activity level. The method also includes retrieving a universal transition segment, where the universal transition segment can be played in sequence with any of the plurality of song segments without creating abrupt musical transitions. The method also includes playing the universal transition segment after the first song segment and playing the second song segment after the universal transition segment in order to create a transition between the first segment and the second segment.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The embodiments can be better understood with reference to the following drawings and description. The components in the figures are not necessarily to scale, emphasis instead being placed upon illustrating the principles of the embodiments. Moreover, in the figures, like reference numerals designate corresponding parts throughout the different views.

DETAILED DESCRIPTION

Figure 1:
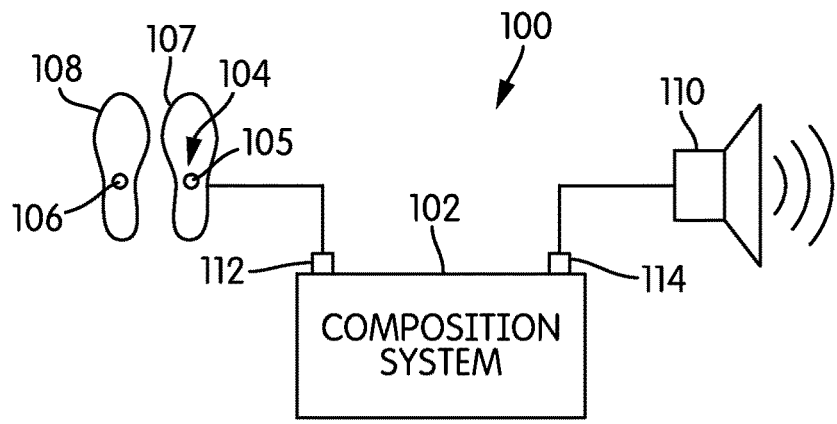
FIG. 1 is a schematic view of an embodiment of an adaptive music playback system.

FIG. 1 is a schematic view of an embodiment of an adaptive music playback system 100. Adaptive music playback system 100 may generally comprise one or more sub-systems, components or devices for adapting the playback of music according to one or more inputs. More specifically, adaptive music playback system 100 may generally be used to adjust the playback of music according to changes in the state of an associated user and/or associated system. For example, the following embodiments discuss systems and methods for adjusting playback of a song using information that characterizes the activity level (i.e., the activity state) of a user. However, the embodiments are not intended to be limiting, and other embodiments could include systems and methods used to adjust the playback of music according changes in other kinds of user states, such as various biometric states, mental and/or emotional states (e.g., user mood) or other kinds of states.

In some embodiments, adaptive music playback system 100 may further include a composition system 102, sensor system 104 and transducer system 110. For purposes of clarity, transducer system 110 is shown schematically in the embodiments. Generally, transducer system 110 may include any number, type and/or arrangement of transducers. Moreover, transducer system 110 may be further associated with provisions for supporting and positioning the transducers (i.e., housings, casings, clips, etc.). In some embodiments, transducer system 110 could include one or more loudspeakers. In other embodiments, transducer system 110 could comprise headphones that may be worn by a user.

Sensor system 104 may comprise one or more sensors, as well as provisions for storing and positioning the sensors. As one example, the schematic sensor system 104 of FIG. 1 depicts a system including a first sensor 105 and a second sensor 106. Although this embodiment depicts a sensor system with two separate sensors, other embodiments may include any number of sensors including one, two, three, four or more sensors.

Sensor system 104 may be configured to detect information associated with the state of a user. In some embodiments, sensor system 104 may detect information related to the motion and/or activity of the user. In other embodiments, sensor system 104 could detect other information including the position of a user (e.g., global position and relative position), biometric information (e.g., heart rate, respiratory rate, perspiration level, etc.), as well as other kinds of information.

Generally, sensors of sensor system 104 may be positioned in any manner relative to a user. In some embodiments, sensor system 104 may be directly attached to a user using clips, bands or similar provisions. In other embodiments, sensor system 104 may be disposed within, or otherwise associated with, portions of an article of footwear, an article of apparel and/or an item of sporting equipment. In some embodiments, each sensor of sensor system 104 may be associated with corresponding articles of footwear. For example, in the schematic embodiment of FIG. 1, first sensor 105 and second sensor 106 are further associated with a first article of footwear 107 and a second article of footwear 108, respectively. By positioning each sensor within an article of footwear, first sensor 105 and second sensor 106 can be used to detect user motion and/or activity as the user walks, runs, jumps or performs other kinds of activities. Thus, for example, sensor system 104 could detect a user's walking or running pace, which may be used to characterize a level of user activity as discussed in further detail below.

Embodiments can use a variety of different sensors capable of sensing information related to a variety of different physical motions, as well as physical and/or biological states. The embodiments may incorporate one or more of the sensors, features, systems, devices, components, methods and/or sensed information disclosed in the following documents: Case et al., U.S. Pat. No. 8,112,251, issued Feb. 7, 2012; Riley et al., U.S. Pat. No. 7,771,320, issued Aug. 10, 2010; Darley et al., U.S. Pat. No. 7,428,471, issued Sep. 23, 2008; Amos et al., U.S. Patent Application Publication Number 2012/0291564, published Nov. 22, 2012; Schrock et al., U.S. Patent Application Publication Number 2012/0291563, published Nov. 22, 2012; Meschter et al., U.S. Patent Application Publication Number 2012/0251079, published Oct. 4, 2012; Molyneux et al., U.S. Patent Application Publication Number 2012/0234111, published Sep. 20, 2012; Case et al., U.S. Patent Application Publication Number 2012/0078396, published Mar. 29, 2012; Nurse et al., U.S. Patent Application Publication Number 2011/0199393, published Aug. 18, 2011; Hoffman et al., U.S. Patent Application Publication Number 2011/0032105, published Feb. 10, 2011; Schrock et al., U.S. Patent Application Publication Number 2010/0063778, published Mar. 11, 2010; Shum, U.S. Patent Application Publication Number 2007/0021269, published Jan. 25, 2007; Schrock et al., U.S. patent application Publication Ser. No. 2013/0213147, now U.S. patent application Ser. No. 13/401,918, filed Feb. 22, 2012, titled "Footwear Having Sensor System"; Schrock et al., U.S. patent application Publication Ser. No. 2013/0213144, now U.S. patent application Ser. No. 13/401,910, filed Feb. 22, 2012, titled "Footwear Having Sensor System", where the entirety of each document is incorporated by reference herein.

Although the embodiment shown in FIG. 1 illustrates sensor systems incorporated into footwear, other embodiments could include sensors incorporated into any other articles of apparel. For example, some other embodiments could have one or more sensors incorporated into pants, shirts, socks, hats, gloves as well as possibly other articles of apparel. Moreover, in some other embodiments, one or more sensors could be incorporated into items of sporting equipment including, but not limited to: bats, balls, gloves, golf clubs, pads, helmets, as well as possibly other kinds of sporting equipment.

Composition system 102 may include various provisions for receiving sensory information and adapting music information for playback through one or more transducers. Methods of adjusting playback of one or more songs and/or sounds are discussed in further detail below.

Generally, composition system 102 can comprise a variety of different systems, components and/or devices. Exemplary systems may include computing systems or portions of computing systems. These computing systems may include hardware such as memory, processors, and possibly networking provisions. Moreover, in some embodiments, composition system 102 may also run software for composing music information into songs, or portions of songs, for playback.

In some embodiments, some components of composition system 102 could be housed in a portable playback device. Exemplary devices include, but are not limited to: smartphones (e.g., the iPhone), digital music players (e.g. the iPod) as well as possibly other portable playback devices. In one exemplary embodiment, provisions of composition system 102 may be incorporated into a smartphone or a digital music player, which may adjust playback of a song according to information received from one or more sensors.

In some embodiments, provisions of composition system 102 for analyzing sensor information and adjusting playback of a song may run directly on a portable playback device. For example, software for receiving sensor information and adjusting playback of a song accordingly could be implemented as an application on a smartphone. However, in other embodiments provisions may be incorporated into separate components or devices. For example, in another embodiment, analysis of sensor information and adjustment of song playback could occur at a remote computing device (e.g., a laptop or desktop computer), which then communicates with a portable device (e.g., a digital music player) for playback. Moreover, communication between separate subsystems, components and/or devices of composition system 102 could be implemented using wired or wireless provisions.

Composition system 102 may include a number of ports that facilitate the input and output of information and power. The term "port" as used throughout this detailed description and in the claims refers to any interface or shared boundary between two conductors. In some cases, ports can facilitate the insertion and removal of conductors. Examples of these types of ports include mechanical connectors. In other cases, ports are interfaces that generally do not provide easy insertion or removal. Examples of these types of ports include soldering or electron traces on circuit boards.

All of the following ports and provisions associated with composition system 102 are optional. Some embodiments may include a given port or provision, while others may exclude it. The following description discloses many of the possible ports and provisions that can be used, however, it should be kept in mind that not every port or provision must be used or included in a given embodiment.

In some embodiments, composition system 102 may include port 112 for receiving information from one or more sensors. In some cases, port 112 is configured to receive information from sensor system 104. In embodiments where a wireless connection is provided between composition system 102 and sensor system 104, wireless communication could be facilitated using any known methods of wireless communication. Likewise, composition system 102 may include port 114 for transmitting information to transducer system 110. Thus, signals may be sent to transducer system 110 via port 114 in order to facilitate playback of a song and/or other sounds.

Figure 2:
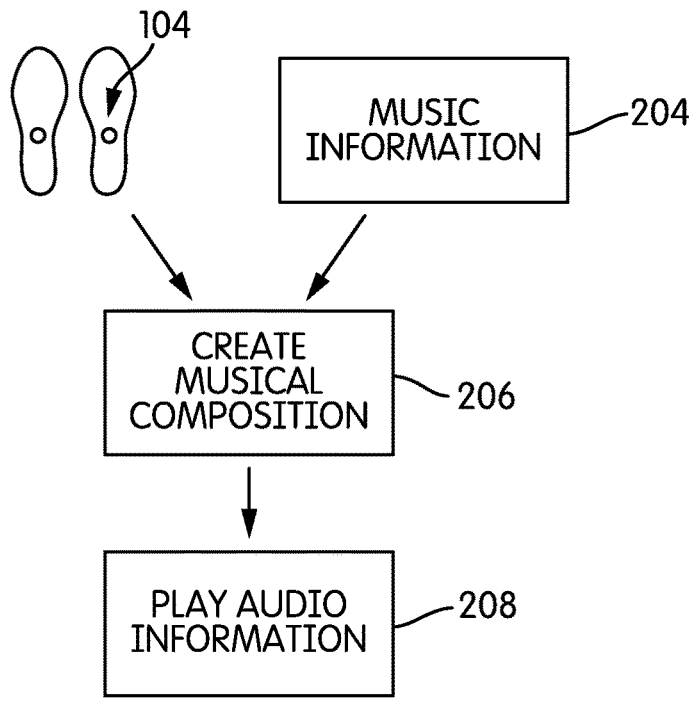
FIG. 2 is a schematic view of a general process for creating musical compositions for playback using sensory input and music information.

FIG. 2 shows a general process of receiving information, processing information and playing audio information corresponding to the processed information. More specifically, information from sensor system 104 is received along with music information 204 for processing. A composition can then be created from the music information 204 in response to the sensory information from sensor system 104 (which may be indicative of user activity) at step 206. The output of this composition process is audio information that can be played at step 208.

Throughout the detailed description and in the claims the term "music information" may refer to various kinds of information related to a particular song, portions of a song (segments or sections), tracks of a song, samples, as well as any other kinds of information. In some cases, music information could also include information about two or more songs, including playlist information that controls flow through multiple songs. More generally, then, music information may refer to any information used to generate songs with a playback device.

The embodiments illustrate some methods of composing music information, including mixing individual tracks to create new compositions. However, in some cases, composing music information may include ordering songs in a playlist. For example, in some other embodiments, a system may be configured to organize a sequence of songs for playback according to various music selection parameters. Other embodiments could use any of the systems, components, devices, and methods for automatically creating a sequence of songs for playback (e.g., generating a playlist or ordering songs in a playlist) that are disclosed in Johnson, U.S. Patent Application Publication Number 2010/0273610, now U.S. patent application Ser. No. 12/768,168, filed Apr. 27, 2010 and titled "Training Program and Music Playlist Generation for Athletic Training," the entirety of which is herein incorporated by reference.

Figure 3:
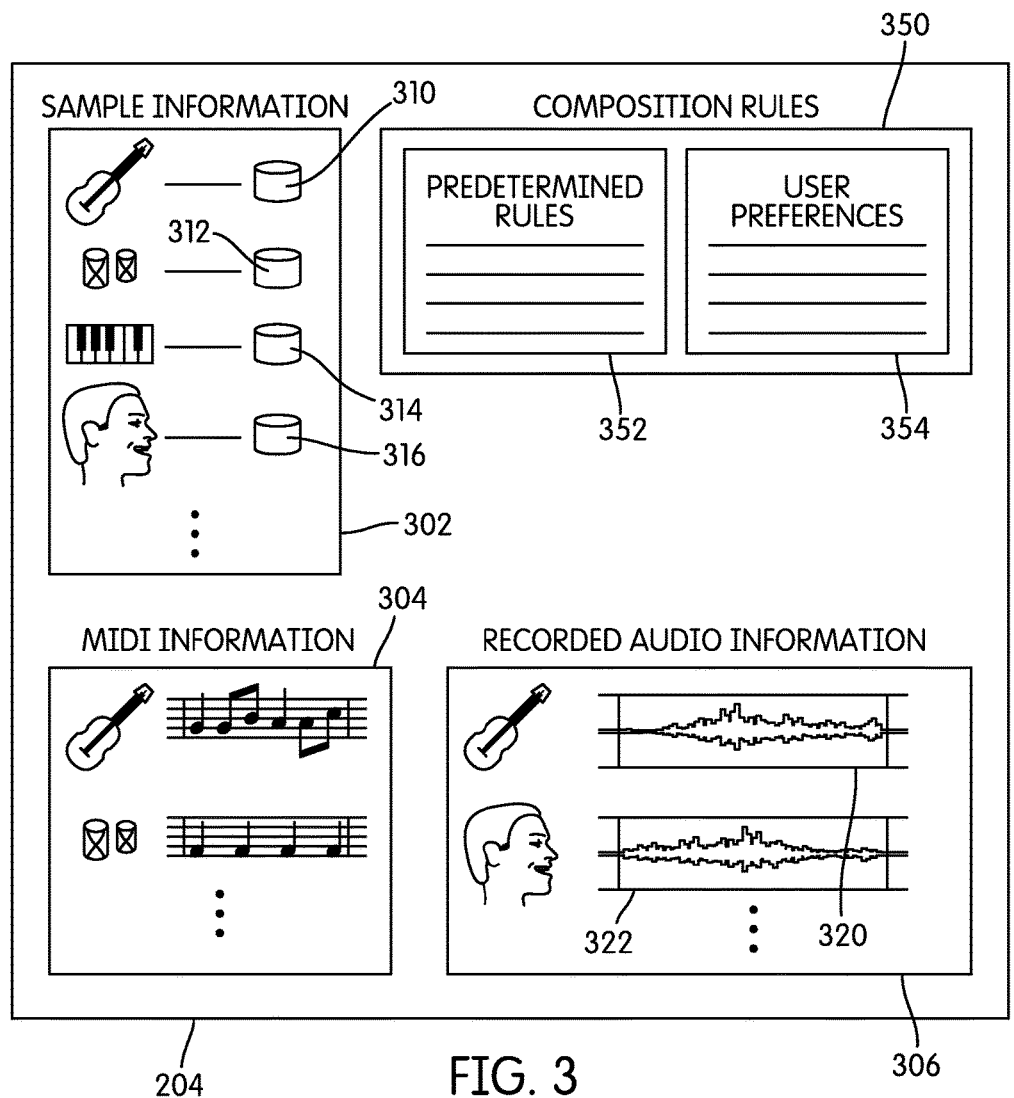
FIG. 3 is a schematic view of an embodiment of some types of music information.

FIG. 3 illustrates a schematic view of some types of music information, according to an embodiment. It will be understood that FIG. 3 is only intended to illustrate some kinds of music information and other embodiments could include additional types of music information. Likewise, some types of music information shown here may be optional in other embodiments.

Music information 204 may include sample information 302. Sample information 302 may include samples for various instruments, voices and/or other sounds that can be stored as individual sound files. As an example, sample information 302 may further include guitar sample 310, drum sample 312, keyboard sample 314 and voice sample 316. Other sample information corresponding to additional instruments, voices and sounds could also be included in some embodiments. The term "sample" is not intended to be limiting and could include any collection of information related to a particular instrument, voice, or other kind of sound.

Some embodiments may make use of MIDI (Musical Instrument Digital Interface) information 304 (including MIDI streams or other MIDI file information). For example, some songs could store a MIDI stream for one or more instruments. When paired with an instrument, voice or sound sample file, the MIDI stream may provide instructions for playing a sequence of notes corresponding to the selected instrument, voice or sound sample file. Thus, MIDI information 304 may be used to store arrangements of sample sounds. In some cases, each MIDI stream may correspond to a track in a multi-track song, or a portion of a track in a multi-track song.

Some embodiments may also utilize recorded audio information 306. Generally, recorded audio information 306 may generally comprise full or partial length audio recordings, which may be stored as recorded audio files. For example, a first recorded audio file 320 may correspond to the audio recording of a guitar playing through the entire length of a song. Likewise, a second recorded audio file 322 may correspond to the audio recording of a vocalist singing through the entire length of a song. As discussed in further detail below, these recorded audio files may each serve as an individual track in a multi-track song.

It will be understood that each different type of music information (e.g., sample information, MIDI stream information, recorded audio information as well as any other kinds of music information) can be stored in a variety of different formats. For example, recorded audio information could be stored using any formats including, but not limited to: uncompressed audio formats (such as WAV, AIFF, AU or PCM), formats with lossless compression (such as FLAC, WavPack, Monkey Audio format, WMA Lossless or MPEG-4 SLS), formats with lossy compression (such as MP3, AAC or WMA lossy) as well as any other kinds of known audio formats. Moreover, any music information files can be used in combination with one or more audio codecs for encoding and decoding raw audio data. Still further, MIDI stream information could be stored using any known MIDI formats, including the Standard MIDI File (SMF) format. Sample information could likewise be stored using any of the formats discussed with regards to recorded audio information.

Embodiments of music information 204 can also include a set of composition rules 350. The term "composition rules" as used throughout this detailed description and in the claims refers to any information that may be used to determine how different audio tracks, or other pieces of music information, may be combined in response to changes in the state of an external system or user (e.g., in response to the increase/decrease in a user's activity level). For clarity, individual composition rules in the set of composition rules 350 may be further classified as predetermined rules 352 or user preferences 354. Predetermined rules 352 may comprise rules that are pre-programmed and may correspond to general composition rules associated with combining different instruments, voices and sounds in a manner that preserves a desired level of musical coherence and limits abrupt musical transitions. Thus, predetermined rules 352 could include, for example, rules for determining which instruments should exit or enter a composition first, as well as which combinations of instruments may play together or not play together. In some cases, predetermined rules 352 could be generic so that similar rules are used with different songs. In other cases, predetermined rules 352 may be specific for each individual song played. In still other cases, predetermined rules 352 may be a combination of both generic rules and song specific rules.

User preferences 354 may comprise composition rules that may be adjusted by a user. For example, user preferences 354 could include a maximum volume setting that prevents one or more tracks from being played back at a volume above the maximum volume setting. As another example, user preferences 354 could include settings to indicate whether the user wants to progress more rapidly through a song, or if the user may not mind repeating portions of the song many times. Another example of a user preference may be a preference for a certain style of music, such as a preference for lots of individual instrument or vocal solos.

The number and type of composition rules may vary from one embodiment to another, and may be generally selected to achieve harmonious transitions between different portions of a song having different overall intensities (or possibly other different characteristics). It will also be understood that composition rules 350 need not be organized separately into predetermined rules 352 and user preferences 354 in other embodiments.

Figure 4:
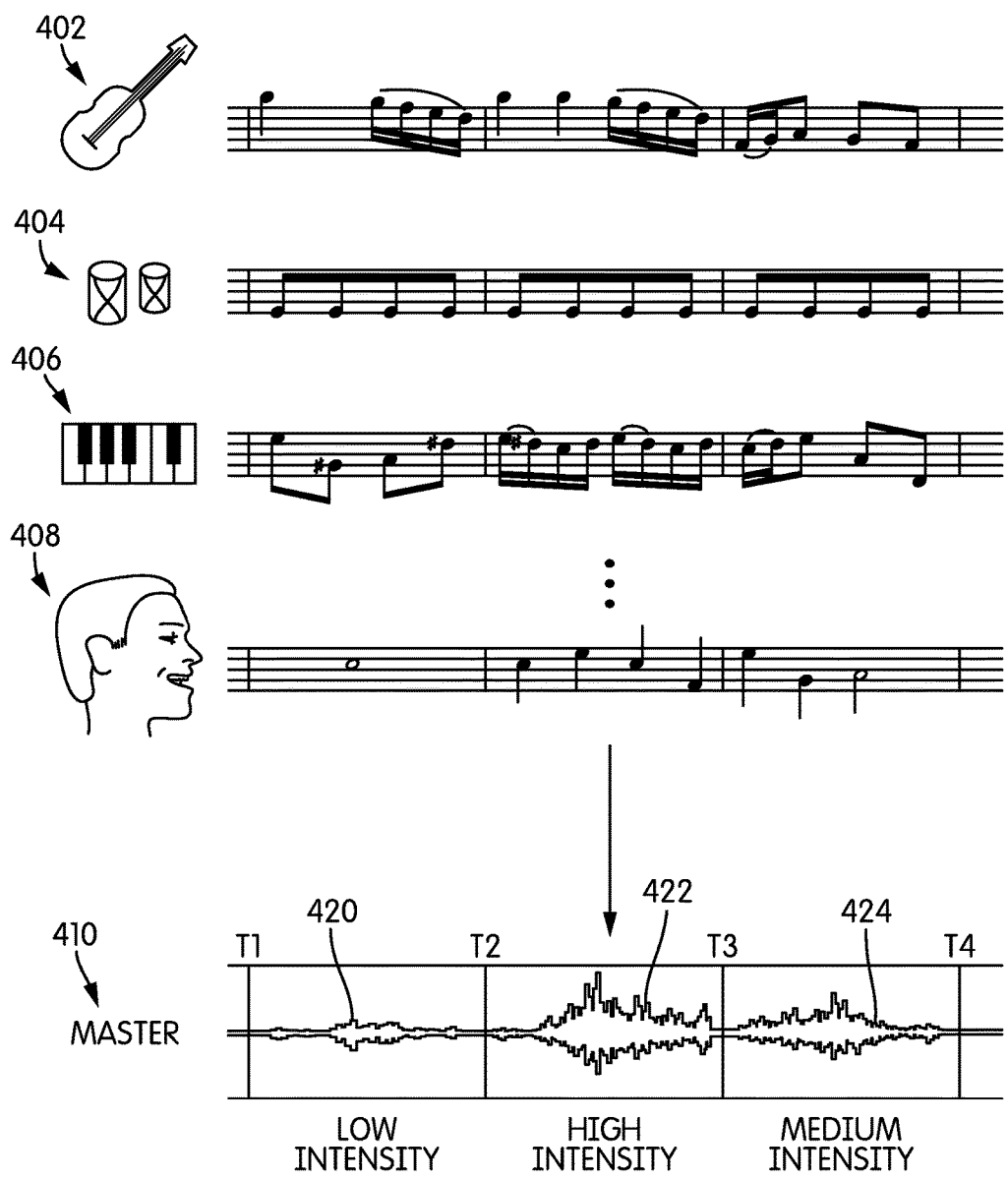
FIG. 4 is a schematic view of an embodiment of a song comprising individual instrument and vocal tracks.

FIG. 4 is a schematic view of an embodiment of a portion of a song, as represented by several instrument/vocal audio tracks and a master audio track (or simply, master track). Referring to FIG. 4, a portion of a song may comprise four different audio tracks, including guitar track 402, drum track 404, keyboard track 406 and vocal track 408. Although represented schematically here using musical notation, each audio track may be stored as an individual audio sound file or as a MIDI stream. Moreover, guitar track 402, drum track 404, keyboard track 406 and vocal track 408 may comprise part of a master track 410, which results from the combination of all the different audio tracks.

For purposes of illustration, master track 410 is indicated schematically in FIG. 4 using waveforms, though it will be understood that master track 410 is composed of each of the individual sounds corresponding to the instruments and notes indicated in guitar track 402, drum track 404, keyboard track 406 and vocal track 408.

As seen here, master track 410 can be divided into individual sections or segments. As used throughout this detailed description and in the claims, the term "segment" refers to a generally continuous portion of a song with a beginning and an end. Thus, a song may be divided into separate segments, which may be sequential in time. For example, the song portion shown in FIG. 4 can include a first song segment 420, a second song segment 422 and a third song segment 424. Each song segment may be characterized by a beginning and an end. In situations where master track 410 is indexed using time, first song segment 420 may begin at time T1 and end at time T2. Second song segment 422 may begin at time T2 and end at time T3. Furthermore, third song segment 424 may begin at time T3 and end at time T4. Although the current embodiments use time as means for indexing different points of master track 410, other embodiments could use any other methods of indexing a song. Moreover, the method of defining one or more segments may vary. In some cases, for example, a segment could correspond to a measure of music, or to a predetermined number of measures. In other cases, a segment could be determined by identifying changes in one or more characteristics of a sequence of audio information, such as changes in the audio waveform. It will also be understood that different segments could have the same length or could have different lengths according to the method of defining each segment.

In the embodiment of FIG. 4, each of first song segment 420, second song segment 422 and third song segment 424 are associated with an intensity level. In particular, first song segment 420 is characterized as a low intensity segment, second song segment 422 is characterized as a high intensity segment and third song segment 424 is characterized as a medium intensity segment.

In still other embodiments, segments of a song can be identified with other musical criteria including, but not limited to, characterizing the segments by key, pitch, loudness, tempo, as well as possibly other musical criteria. Moreover, in some cases, individual tracks could likewise be divided into segments characterized according to key, pitch, loudness, tempo as well as possibly other musical criteria.

Figure 5:
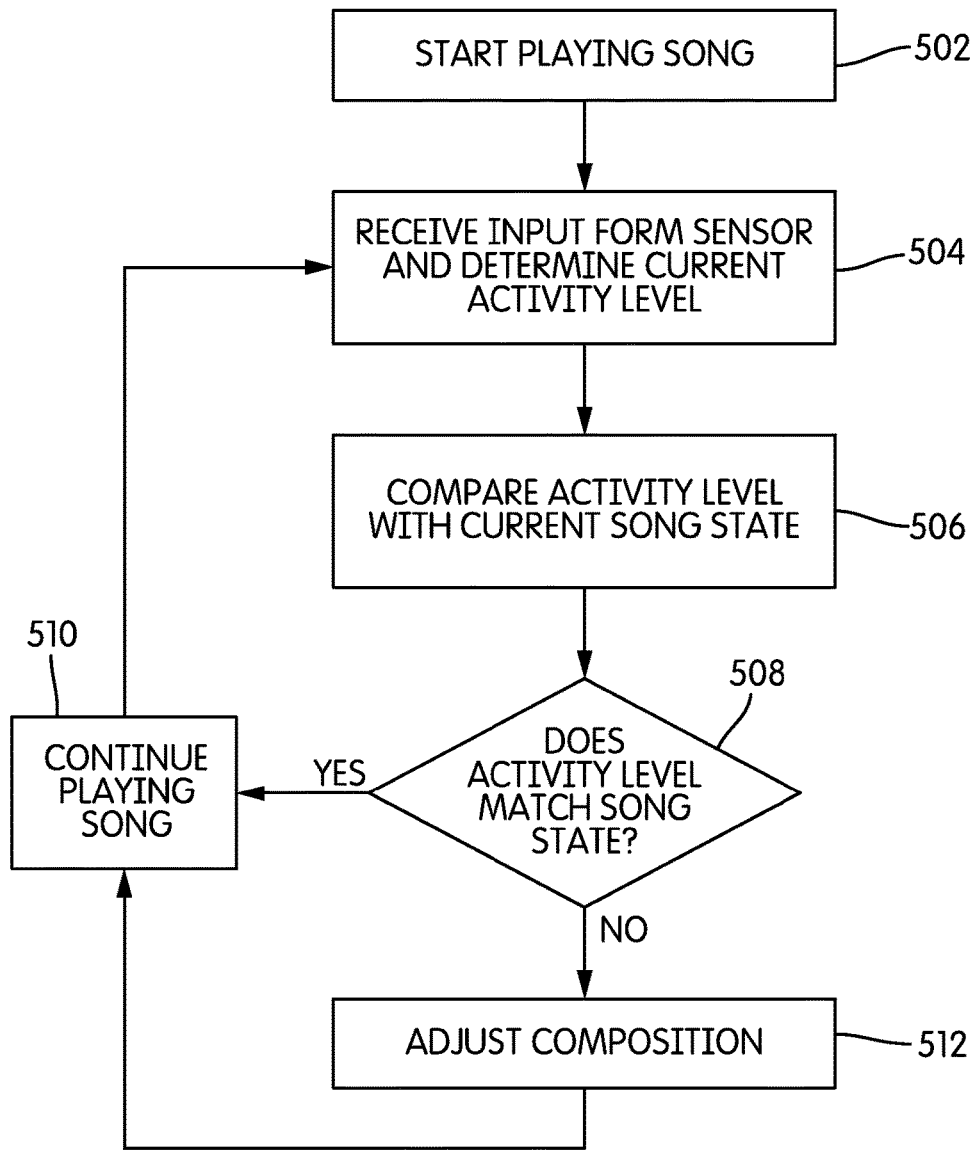
FIG. 5 is an embodiment of a process for adjusting the composition of a song in response to user activity.

FIG. 5 illustrates an embodiment of a process for adjusting the composition of a song, or otherwise adjusting the playback of a song, according to detected changes in user activity. In some embodiments, some of the following steps could be accomplished by composition system 102 (see FIG. 1). In other embodiments, some of the steps could be accomplished by any other components, systems or devices associated with adaptive music playback system 100. It will be understood that in other embodiments one or more of the following steps may be optional.

At step 502, composition system 102 may start playing a song. This may occur in response to user input, such as a user pressing play on a digital music device, or in response to other kinds of input such as user motion. Next, in step 504, composition system 102 may receive input from one or more sensors (e.g., one or both of the sensors of sensor system 104).

During step 504, the information from one or more sensors may be used to determine a current activity level for the user. The term "activity level" as used throughout this detailed description and in the claims refers to a value or set of values for characterizing user activity or user motion including, but not limited to, user speed, user acceleration, user position, user gait, user stride, ground contact force as well as possibly other characterizations of user activity. In some cases, the user activity level may be determined by considering a combination of such factors. The activity level may take on continue values, for example, a continuous value in the range of 0 (least activity) to 10 (greatest activity). The activity level may also take on discrete values. For example, some embodiments could utilize a three value activity level scale, with "low activity", "moderate activity" and "high activity" values.

At step 506, composition system 102 may compare the activity level determined in step 504 with the current song state. The song state may generally be characterized according to any known factors, including but not limited to: intensity, tempo, complexity, key, and pitch as well as possibly other factors. In some embodiments, the song state may generally refer to song intensity, which could be one of low intensity, medium intensity or high intensity. However, other embodiments could use any other methods for characterizing the song state, including any of the factors listed above as well as any combination of these factors. The embodiments described here may generally use a notion of song state that can be matched with user activity levels. For example, various song intensities could be matched with corresponding user activity levels.

In step 508, composition system 102 may determine if the user activity level matches the current song state. For example, composition system 102 may determine if the current user activity level matches the current song intensity (i.e., the intensity of the song segment currently being played). If there is a match, composition system 102 proceeds to step 510 and may continue playing the song without any adjustments. However, if there is a mismatch between the activity level and the current song state, composition system 102 may proceed instead to step 512. At step 512, composition system 102 may adjust the composition by changing to a different song segment and/or adjusting the composition of one or more audio tracks. Various methods for accomplishing this composition adjustment are discussed in further detail below.

Figure 6:
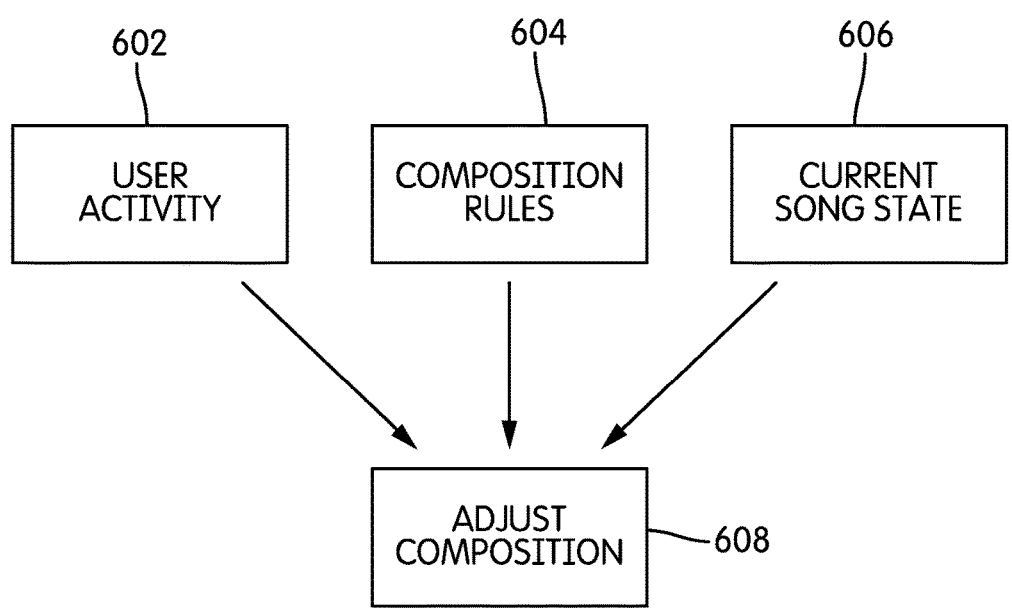
FIG. 6 is a schematic view of an embodiment of several inputs used for adjusting the composition of a song.

As seen in FIG. 6, several factors may be considered by composition system 102 in order to determine how to adjust the song composition. Specifically, any process of adjusting the composition of a song, indicated schematically as process 608, may use one or more inputs. These include user activity 602, composition rules 604 and the current song state 606. In particular, user activity 602 and current song state 606 may be monitored continuously. When user activity 602 and current song state 606 are mismatched, the composition may then be adjusted in a manner determined by composition rules 604.

Figure 7:
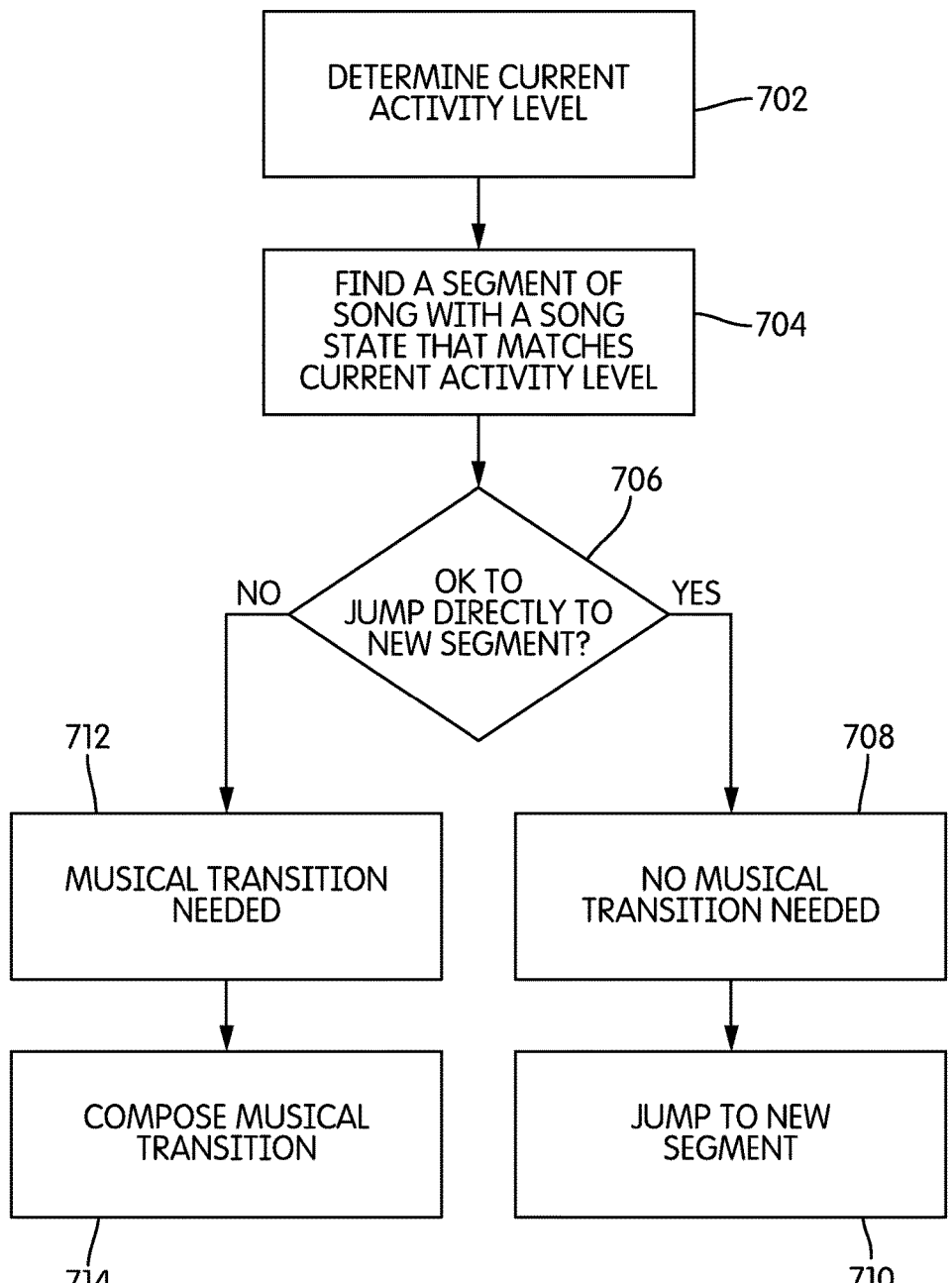
FIG. 7 is an embodiment of a detailed process for adjusting the composition of a song.

FIG. 7 illustrates an embodiment of a process for adjusting the composition of a song, or otherwise adjusting the playback of a song, according to detected changes in user activity. In some embodiments, some of the following steps could be accomplished by composition system 102 (see FIG. 1). In other embodiments, some of the steps could be accomplished by any other components, systems or devices associated with adaptive music playback system 100. It will be understood that in other embodiments one or more of the following steps may be optional.

At step 702, composition system 102 may determine the current activity level of the user. This may be done by analyzing information from one or more sensors. Next, in step 704, composition system 102 may find a new segment of the song that has a song state that matches the current user activity level. For example, composition system 102 may find a segment of a song with an intensity corresponding to the current activity level. In some cases, this could be accomplished by performing a real-time analysis of the audio information to find a segment with a matching intensity. In other cases, intensity levels for different song segments could be stored in a table or database for easy retrieval.

Generally, the system may be configured to associate activity level with intensity. For example, a high user activity level that is greater than some threshold may correspond to a high intensity. Any method for determining an intensity from a user activity level could be used. In some embodiments, a function or table may be used to automatically map user activity levels to corresponding intensities, where the inputs (user activity level) and the outputs (intensity) could be continuous and/or discrete values.

In step 706, composition system 102 may determine if it is ok to jump directly to the new segment having an intensity corresponding to the current user activity level. Such a decision could be made by comparing various musical characteristics of the current segment with characteristics of the new segment. If it is determined that there is already a good musical match between the current segment and the new segment, composition system 102 may determine that it is ok to directly jump to the new segment and proceed to step 708. At step 708, composition system 102 determines that no musical transition is needed and proceeds to step 710, where composition system 102 may jump to the new segment.

However, if during step 706 composition system 102 determines that jumping directly to the new segment is not desirable, composition system 102 proceeds to step 712. In step 712 composition system 102 determines that a musical transition is needed between the current song segment and the new song segment. At step 714, therefore, composition system 102 proceeds to compose the necessary musical transition.

Figure 8:
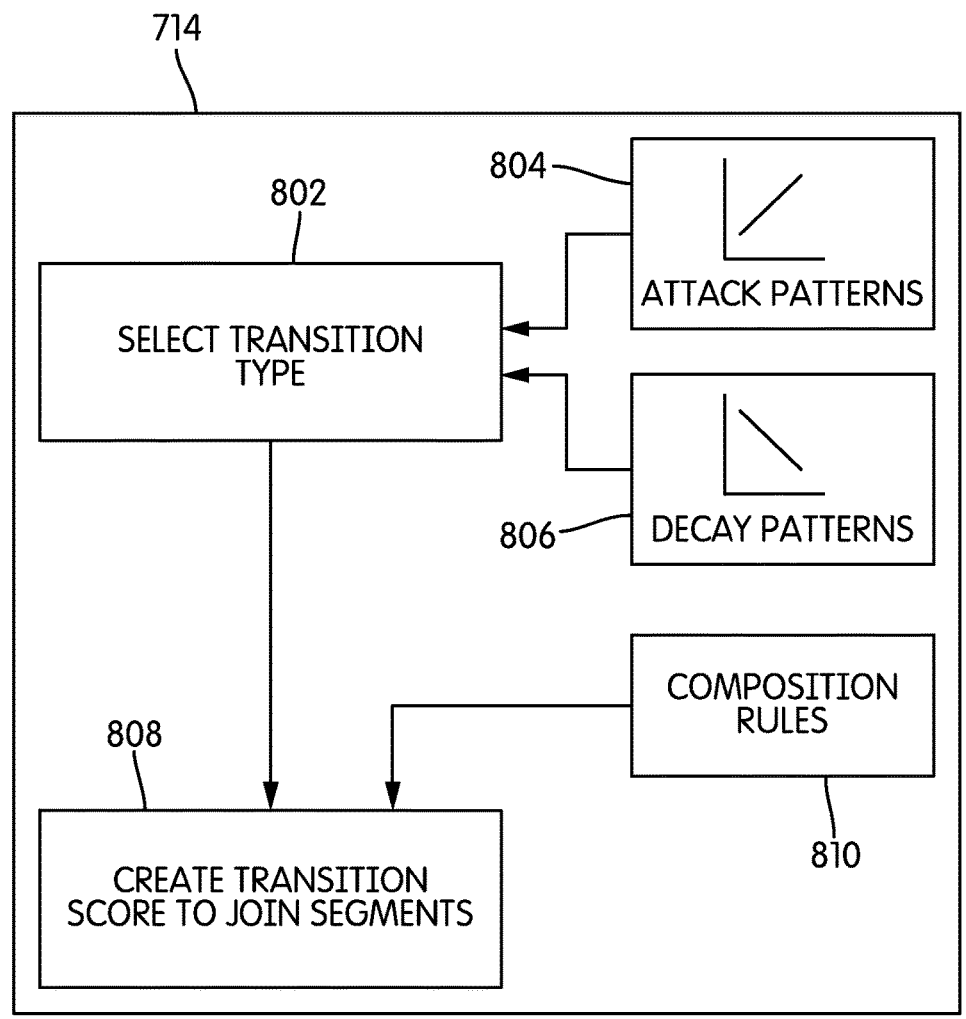
FIG. 8 is an embodiment of a process for composing a musical transition.

FIG. 8 illustrates some possible steps in the process of composing a musical transition. During a step 802, composition system 102 may select a general transition type. For example, composition system 102 may determine if an attack type pattern 804 is needed or if a decay type pattern 806 is needed. In situations where the current song segment has a low musical intensity and the new song segment has a high musical intensity, composition system 102 may select an attack pattern, which generally allows for the gradual introduction of audio tracks during the transition. In situations where the current song segment has a high musical intensity and the new song segment has a low musical intensity, composition system 102 may select a decay pattern, which generally allows for the gradual removal of audio tracks during the transition. While the embodiment illustrates two basic kinds of transition patterns, namely attack patterns and decay patterns, other embodiments could incorporate any number of predetermined transition patterns including linear patterns, non-linear patterns as well as any other known transition patterns or combinations of known transition patterns.

Once a general transition type has been selected in step 802, composition system 102 may proceed to step 808. At step 808, composition system 102 may compose a transition score to join the segments. In particular, this process may make use of composition rules 810 to determine the timing of entry and/or exit of different audio tracks throughout the transition. This process may also use composition rules 810 to determine the relative volume settings of different audio tracks throughout the transition.

Figure 9:
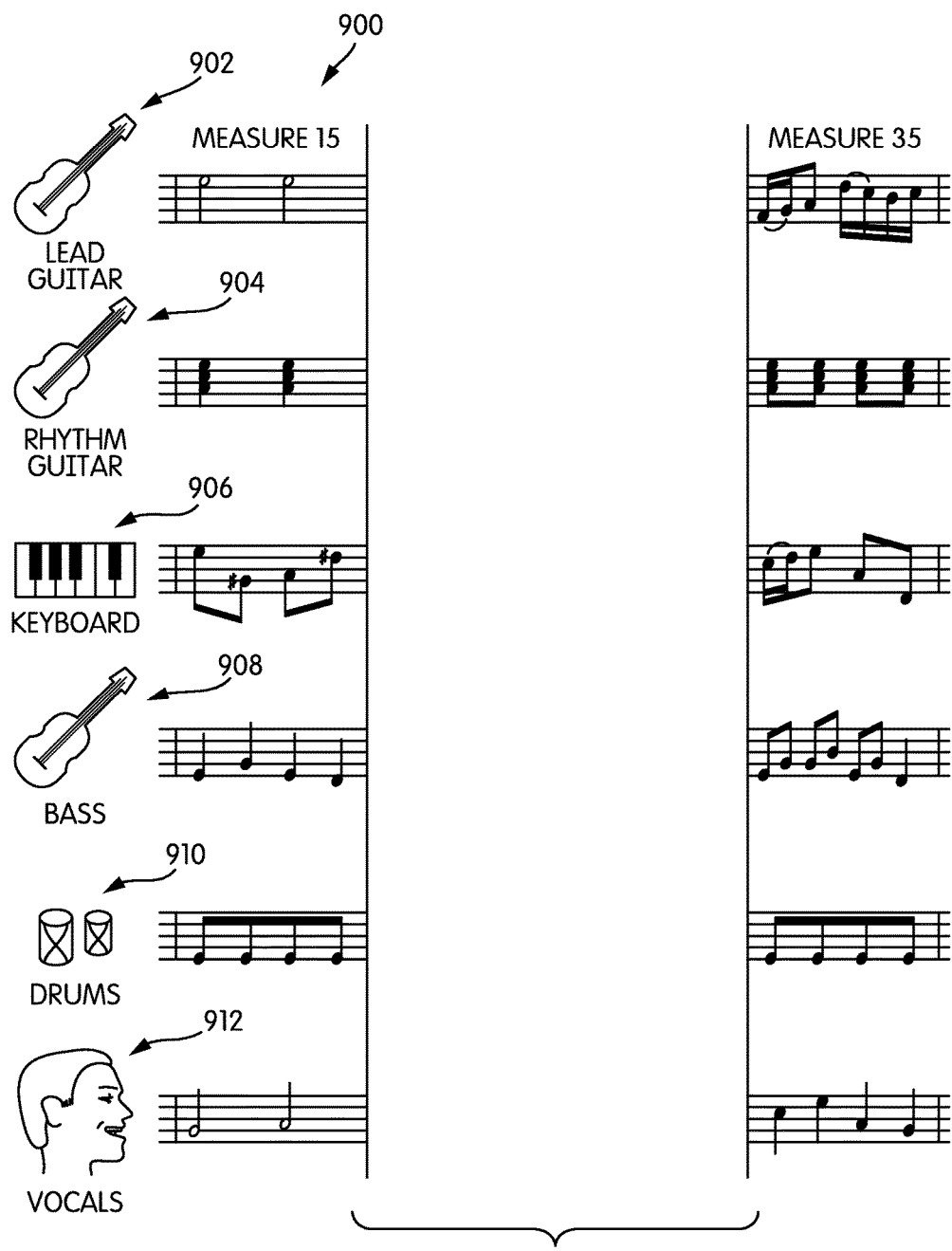
FIG. 9 is a schematic view of several instrument and vocal tracks at two measures having different intensities.

FIG. 9 illustrates a schematic view of at least some tracks in a portion of a song 900. The portion of song 900 includes lead guitar track 902, rhythm guitar track 904, keyboard track 906, bass track 908, drum track 910 and vocal track 912. For purposes of illustration, each track is indicated schematically by an instrument and an associated sequence of musical notes. However, it will be understood that the music information representing each track could be stored (and analyzed) in a variety of formats.

FIG. 9 is intended to schematically indicate a configuration in which a musical transition is needed to move from measure 15 of song 900 to measure 35, bypassing some or all of the measures between measure 15 and measure 35. In this case, measure 15 may be characterized as having a moderate intensity, in contrast to measure 35, which has a high intensity. The need to create such a transition could arise if the user activity level rises from a moderate level (matching well with measure 15) to a high level (matching well with measure 35) while measure 15 is being played.

Figure 10:
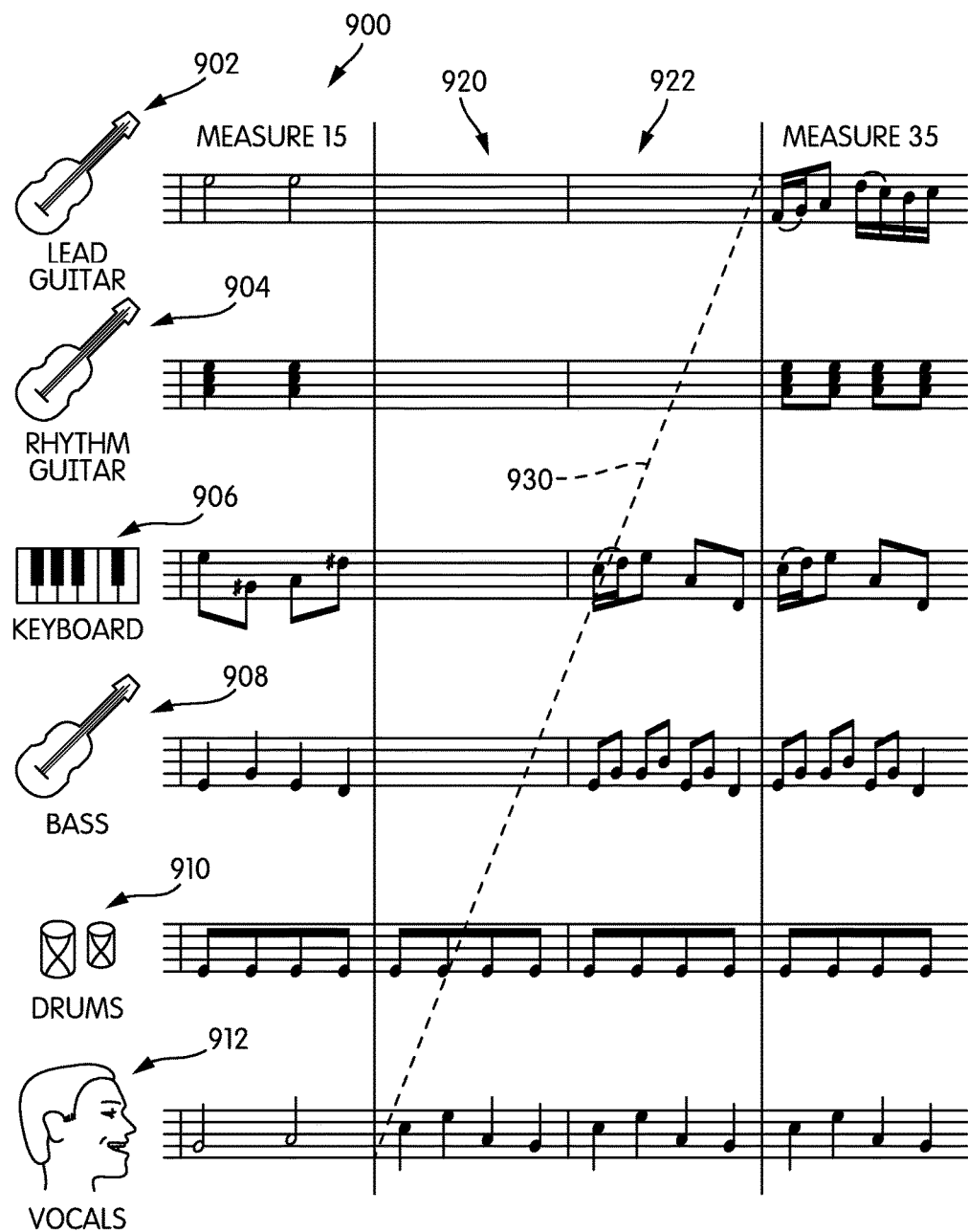
FIG. 10 is a schematic view of several instrument and vocal tracks at two measures having different intensities, in which a transition has been generated between the measures.

FIG. 10 illustrates one possible way of generating a musical transition to move from measure 15 to measure 35 by timing the entrance of one or more tracks. In this example, two extra copies of measure 35 (referred to as first transition measure 920 and second transition measure 922) are used as the basis of the transition. Moreover, composition rules 350 (see FIG. 3) may be used to determine which tracks are played during these two extra measures.

In some embodiments, decisions to mute or unmute tracks (i.e., control the entrance and exit of tracks) can be based on one or more general patterns, such as attack patterns or decay patterns. As seen in FIG. 10, transition line 930 represents an idealized transition pattern for unmuting tracks as the song progresses from the end of measure 15 to the beginning of measure 35. Such a transition pattern may therefore serve as a first approximation or guide to gradually increasing the intensity of the song. However, to ensure that there is musical continuity/coherence and to reduce abrupt changes in instruments and sounds, composition rules 350 may be used to ensure each track enters or exits the song at preferred times. For example, rather than having a track enter in the middle of a measure, composition rules 350 may be used to ensure a full measure is played (or muted) in order to preserve the musical integrity of each audio track and harmony between audio tracks.

As seen in FIG. 10, lead guitar track 902, rhythm guitar track 904, keyboard track 906 and bass track 908 are muted during first transition measure 920, while drum track 910 and vocal track 912 are played. Since drum track 910 is unchanged from measure 15 to measure 35, playing drum track 910 through first transition measure 920 and second transition measure 922 provides musical continuity. Likewise, vocal track 912 may play through first transition measure 920 and second transition measure 922 if it is determined that transition in vocals from measure 15 to measure 35 is musically harmonious and not too abrupt. As the song progresses to second transition measure 922 additional tracks are added in rough (but not exact) correspondence to transition line 930. In particular, keyboard track 906 and bass track 908 are added during second transition measure 922 to increase the intensity gradually, while maintaining the musical integrity of the song. Finally, in progressing to the original measure 35, lead guitar track 902 and rhythm guitar track 904 are added to provide the high intensity sound of measure 35.

Figure 11:
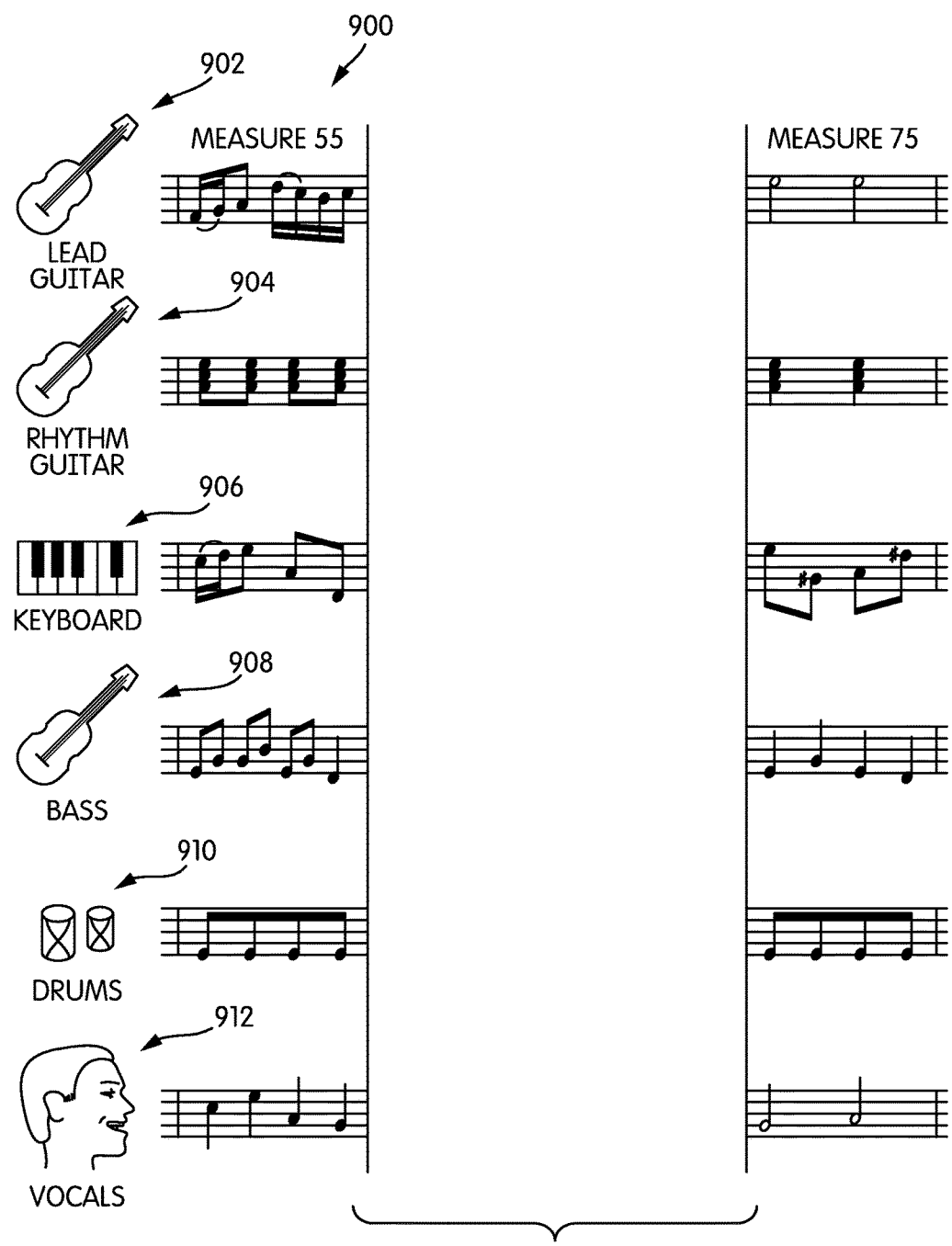
FIG. 11 is a schematic view of several instrument and vocal tracks at two measures having different intensities.

FIG. 11 is intended to schematically indicate another configuration in which a musical transition is needed to move from measure 55 of song 900 to measure 75, bypassing some or all of the measures between measure 55 and measure 75. In this case, measure 55 may be characterized as having a moderate intensity, in contrast to measure 75, which has a low intensity. The need to create such a transition could arise if the user activity level decreases from a moderate level (matching well with measure 55) to a low level (matching well with measure 75) while measure 55 is being played.

Figure 12:
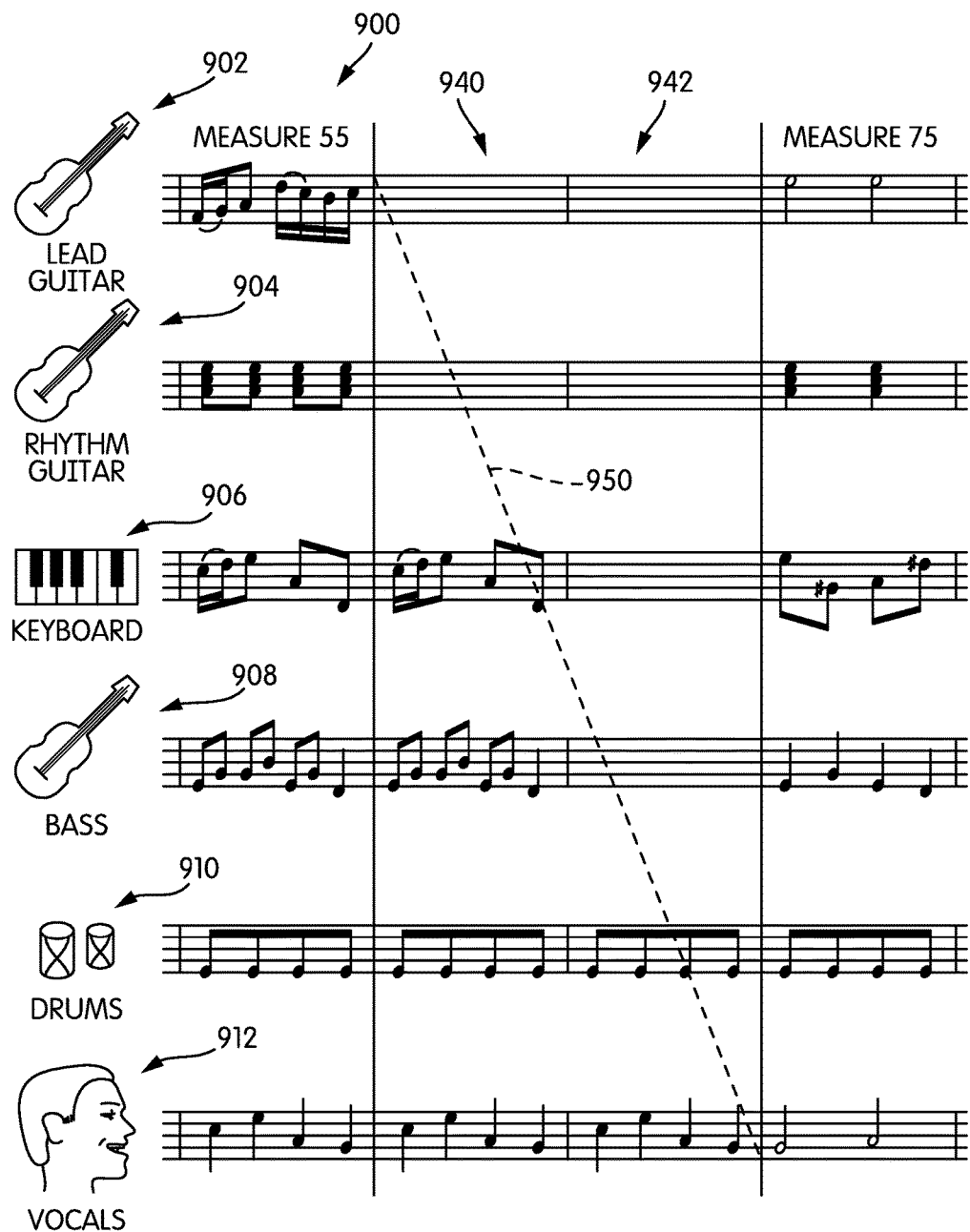
FIG. 12 is a schematic view of several instrument and vocal tracks at two measures having different intensities, in which a transition has been generated between the measures.

FIG. 12 illustrates one possible way of generating a musical transition to move from measure 55 to measure 75 by timing the entrance of one or more tracks. In this example, two extra copies of measure 55 (referred to as third transition measure 940 and fourth transition measure 942) are used as the basis of the transition. Moreover, composition rules 350 (see FIG. 3) may be used to determine which tracks are played during these two extra measures.

In some embodiments, decisions to mute or unmute tracks (i.e., control the entrance and exit of tracks) can be based on one or more general patterns, such as attack patterns or decay patterns. As seen in FIG. 12, transition line 950 represents an idealized transition pattern for unmuting tracks as the song progresses from the end of measure 55 to the beginning of measure 75. Such a transition pattern may therefore serve as a first approximation or guide to gradually reducing the intensity of the song. However, to ensure that there is musical continuity and reduce abrupt changes in instruments and sounds, composition rules 350 may be used to ensure each audio track enters or exits the song at preferred times. For example, rather than having a track enter in the middle of a measure, composition rules 350 may be used to ensure a full measure is played (or muted) in order to preserve the musical integrity of each audio track and harmony between audio tracks.

As seen in FIG. 12, lead guitar track 902 and rhythm guitar track 904 are muted in third transition measure 940 to help gradually lower the intensity. As the song progresses to fourth transition measure 942, keyboard track 906 and bass track 908 are muted. As the song progresses to the original measure 75, all tracks are unmuted. Specifically, lead guitar track 902, rhythm guitar track 904, keyboard track 906 and bass track 908 all enter again at measure 75, as the combination of all these tracks at measure 75 results in the desired low intensity sound.

Embodiments can include provisions to adjust song intensity without changing song segments. In some embodiments, one or more audio tracks could be controlled to enter and/or exit the song so that the intensity of the current segment is modified to match the user activity level.

Figure 13:
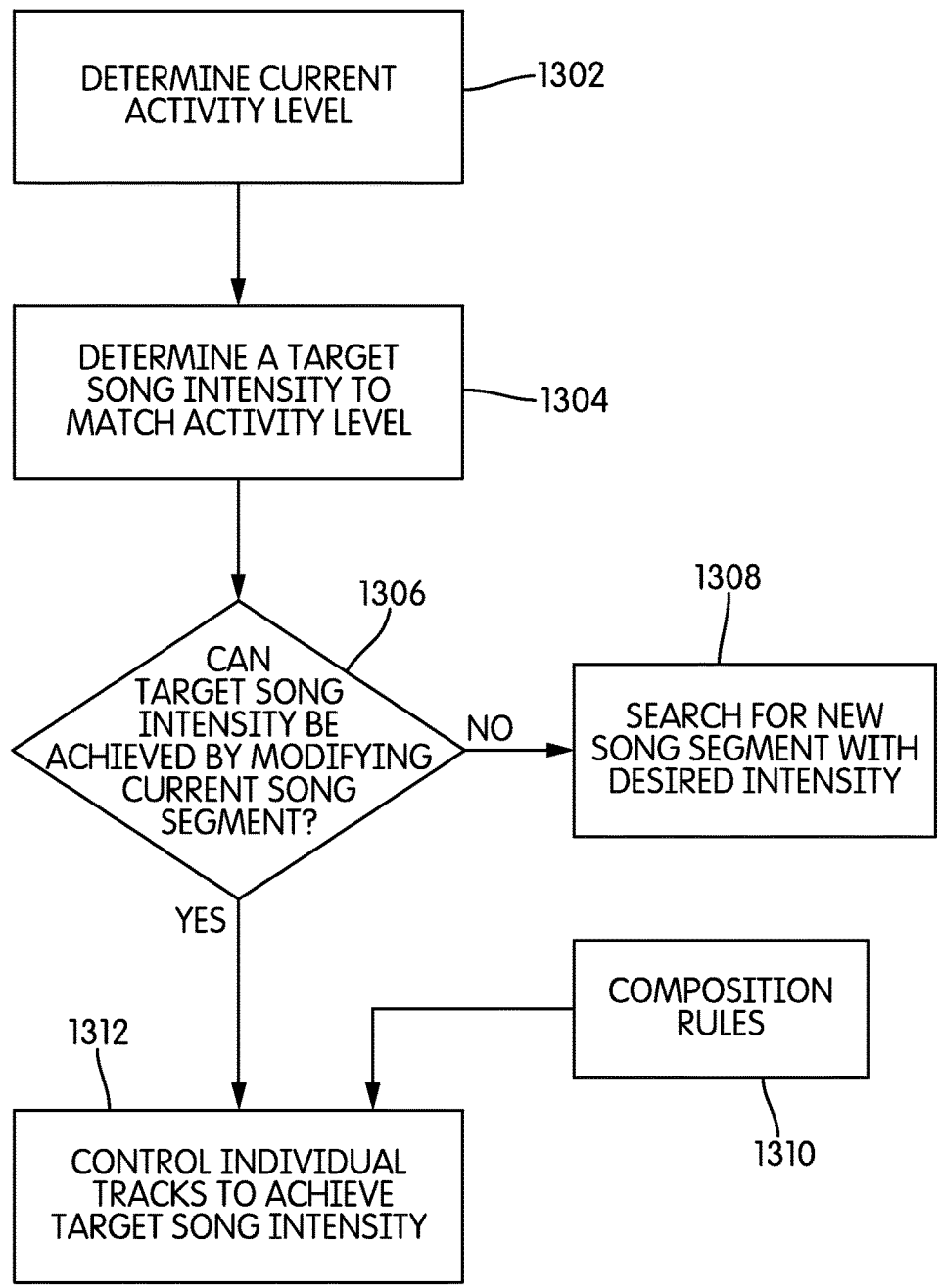
FIG. 13 is an embodiment of a process for modifying individual tracks in a song segment to achieve a desired song intensity.

FIG. 13 illustrates an embodiment of a process for controlling the fading in and out (or entry and exit) of audio tracks throughout a continuous segment of a song. As previously discussed, some or all of the following steps could be accomplished by composition system 102, as well as any other associated systems, components or devices.

In step 1302, composition system 102 may determine the current activity level. This may be determined by analyzing information from one or more sensors. Next, in step 1304, composition system 102 may determine a target song intensity to match the activity level detected in step 1302. Following this, in step 1306, composition system 102 may determine if the target song intensity can be achieved by modifying the current song segment. If not, composition system 102 may proceed to step 1308. At step 1308, composition system 102 may search for a new song segment with the desired target song intensity.

If in step 1306, composition system 102 determines that the target song intensity can be achieved by modifying the current song segment, composition system 102 may proceed to step 1312. In step 1312, composition system 102 uses composition rules 1310 to control individual audio tracks so that the target song intensity is achieved. In particular, composition system 102 may control the fading in and out of various tracks to achieve the target song intensity within the current song segment, rather than jumping to another song segment.

Figure 14:
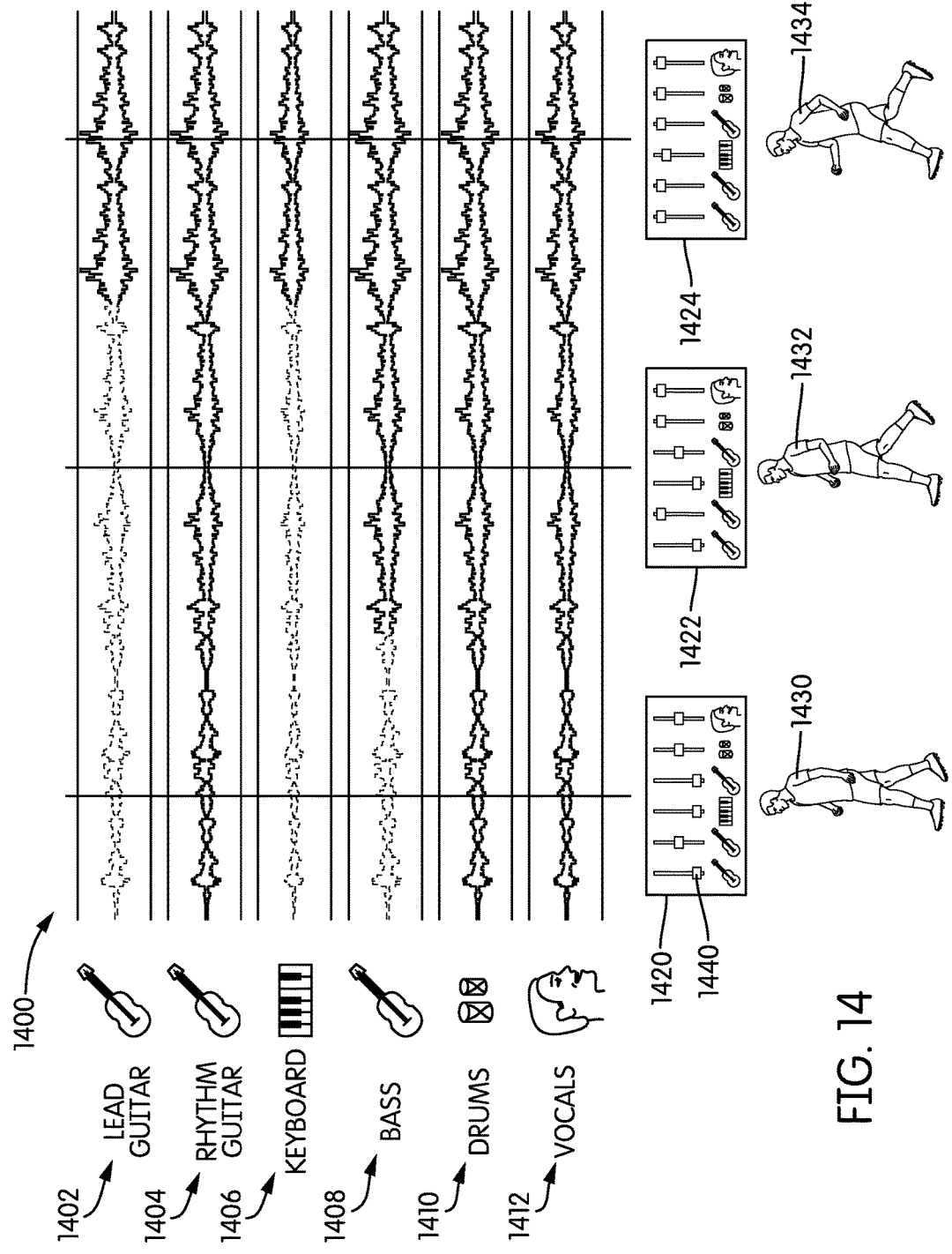
FIG. 14 is a schematic view of an embodiment of a portion of a song with different tracks faded in and out according to the activity level of a user.

FIG. 14 illustrates schematically how a composition system may fade audio tracks in and out of a particular song segment or passage according to user activity (and using a set of composition rules). Referring to FIG. 14, song 1400 includes lead guitar track 1402, rhythm guitar track 1404, keyboard track 1406, bass track 1408, drum track 1410 and vocal track 1412. In this embodiment, each audio track is represented schematically as a waveform or sound signal. For example, each audio track shown here may represent an individual audio file for a corresponding instrument.

Also shown in FIG. 14 are different configurations of a schematic mixing board, including a first mixing board configuration 1420, a second mixing board configuration 1422 and a third mixing board configuration 1424. Likewise, a user of adaptive music playback system 100 is seen in a first user state 1430, a second user state 1432 and a third user state 1434 that correspond to a low activity level, a moderate activity level and a high activity level, respectively.

FIG. 14 shows how the song state, including which tracks are played and which tracks are muted, changes in response to user activity. In the first user state 1430, the user may be walking and therefore has a low activity level. To accommodate the low activity level of the user, composition system 102 mutes lead guitar track 1402, keyboard track 1406 and bass track 1408. Additionally, the volume levels of rhythm guitar track 1404, drum track 1410 and vocal track 1412 are set to a medium volume. These various track settings, corresponding to positions of fader bars 1440, are selected using composition rules 350 (see FIG. 3) to achieve a desired intensity level while maintaining musical integrity.

In the second user state 1432 the user may be jogging, or walking quickly, and therefore has a moderate activity level. To accommodate this increase in activity, composition system 102 unmutes bass track 1408 and further increases the volume of rhythm guitar track 1404, drum track 1410 and vocal track 1412. This increases the intensity of the current song segment from low to medium.

Finally, in the third user state 1434, the user may be running and therefore has a high activity level. In response to this increase in activity, composition system 102 unmutes lead guitar track 1402 and keyboard track 1406 and sets the volume of all the tracks to the maximum values (or close to maximum values). This increases the intensity of the current song segment from medium to high.

As previously discussed, the decisions to mute or unmute particular tracks and the timing at which the tracks are muted or unmuted are made by composition system 102 according to composition rules 350. In particular, the entry and/or exit of tracks is managed to ensure that various desirable musical characteristics, such as intensity, tempo, pitch, and key as well as other possible musical characteristics, are maintained or varied in a smooth manner without undesirable breaks, jumps or interruptions. Thus, for example, the intensity of the song can be gradually increased without creating abrupt changes in tempo, pitch and key, which would be undesirable for the user.

Figure 15:
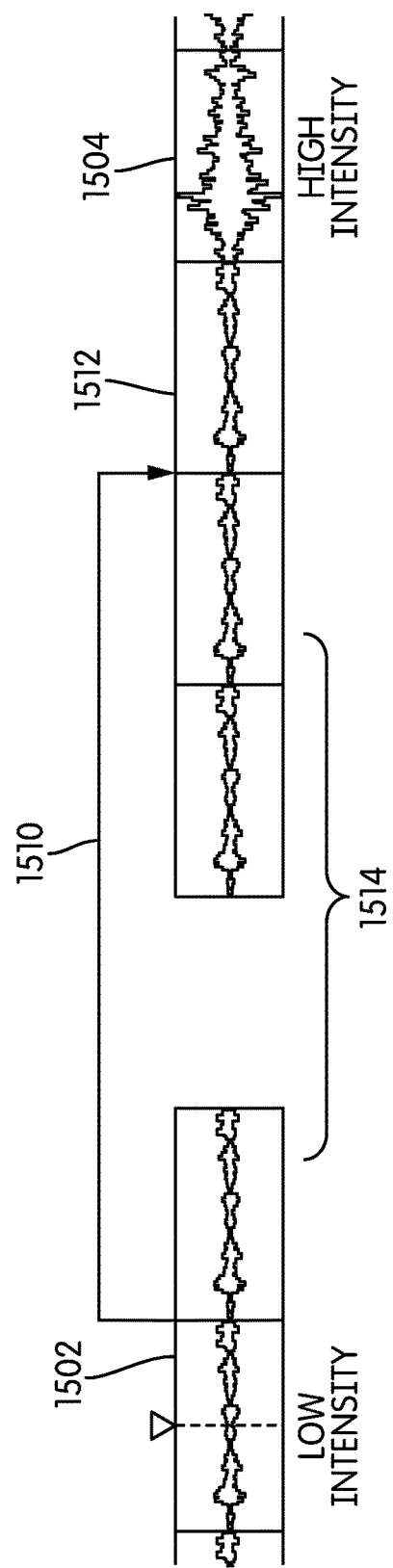
FIG. 15 is a schematic view of an embodiment of a portion of a song, including a shortest path from a low intensity song segment to a high intensity song segment.

In some embodiments, composition system 102 may be configured to bypass, or skip, some segments of a song to arrive sooner at a segment having a desired intensity. One possible example of such an embodiment is schematically shown in FIG. 15. Referring to FIG. 15, a current segment 1502 is currently being played. This segment is a low intensity segment and may generally be played for a user during low intensity activities such as walking.

In response to a sudden increase in user activity, composition system 102 may determine that a high intensity song segment is needed. In this exemplary embodiment, composition system 102 determines that target segment 1504 has the desired high intensity. However, jumping directly to target segment 1504 in this case would produce a jarring musical transition. Instead, composition system 102 determines that intermediate segment 1512, which is a segment just previous to target segment 1504, has a similar musical structure to current segment 1502. Therefore, composition system 102 generates a musical path or musical sequence 1510 through the song in which composition system 102 jumps from the end of current segment 1502 to the beginning of intermediate segment 1512, and also bypasses a plurality of low intensity segments 1514. From intermediate segment 1512 there is already a natural musical transition to target segment 1504. Thus, the musical sequence 1510 is seen to comprise a sequence of song segments that is different from the normal sequence of the song, and which facilities moving more quickly between segments having varying intensities.

Figure 16:
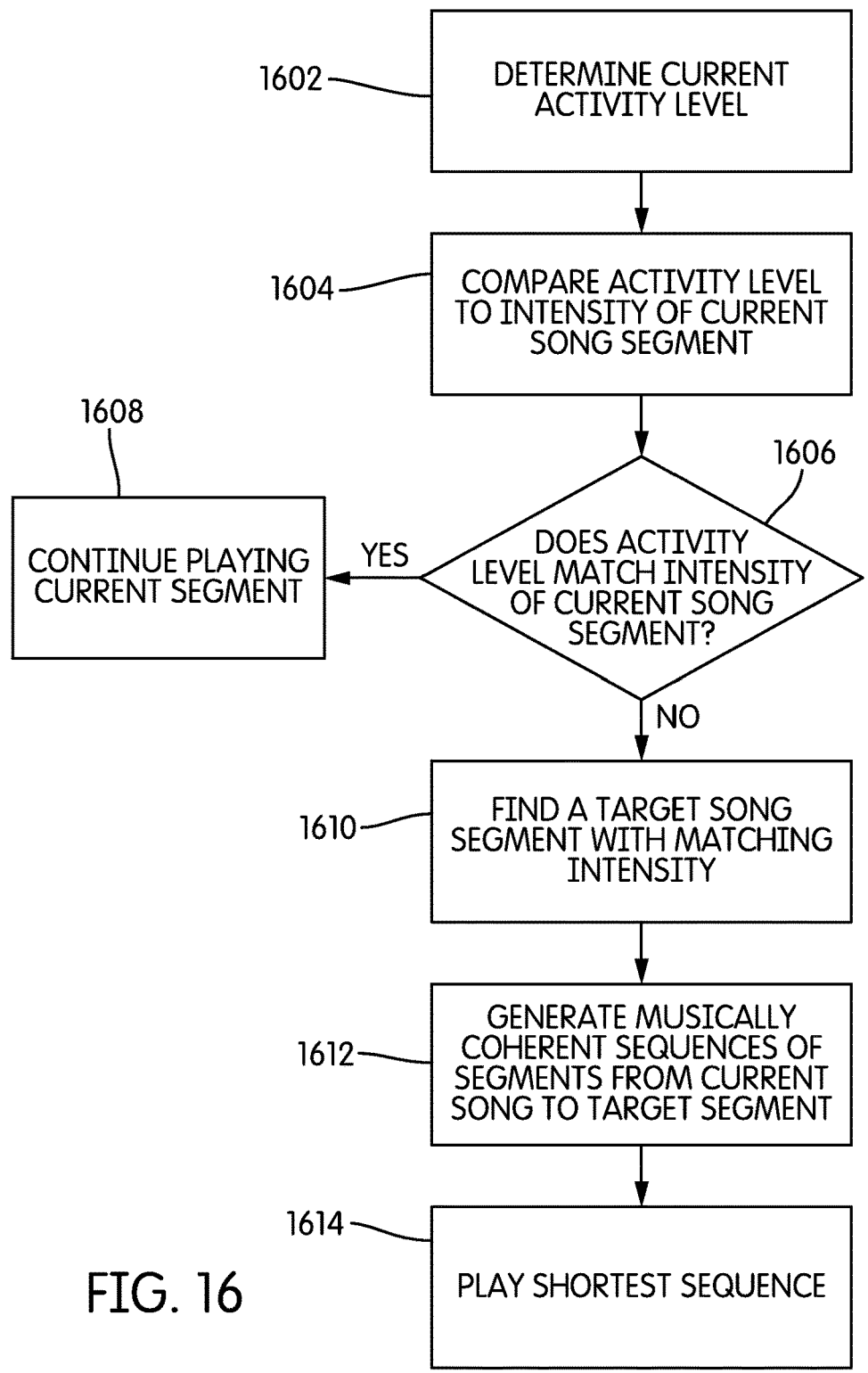
FIG. 16 is an embodiment of a process for generating a shortest sequence of musical segments between two segments of different intensity levels.

FIG. 16 is an embodiment of a process for moving between song segments of different intensities in a way that maintains musical coherence and avoids abrupt breaks or transitions in one or more musical attributes. As previously discussed, in some embodiments, one or more steps of the process can be performed by composition system 102. However, in other embodiments, some steps could be performed by any other associated component, device or system. Moreover, some steps may be optional in other embodiments.

In step 1602, composition system 102 may determine a current activity level using information from one or more sensors. Next, in step 1604, composition system 102 may compare the activity level to the intensity of the current song segment. In step 1606, composition system 102 determines if the activity level matches the intensity of the current song segment. If not, composition system 102 proceeds to step 1608 and continues playing the song without adjustment.

If there is a mismatch between activity level and song intensity in step 1606, composition system 102 may move to step 1610. In step 1610, composition system 102 finds at least one target song segment that has a matching intensity for the current activity level. Next, in step 1612, composition system 102 generates one or more musically coherent sequences of segments, where each sequence starts with the current segment and ends with the target segment. Each sequence thus provides a path through the song from the current segment to the target segment. In step 1614, composition system 102 may play the shortest sequence from the set of sequences found in step 1612. This allows composition system 102 to transition to a song segment with an intensity that matches the user activity in the shortest time possible. This helps increase the response of the system to changes in user activity.

Figure 17:
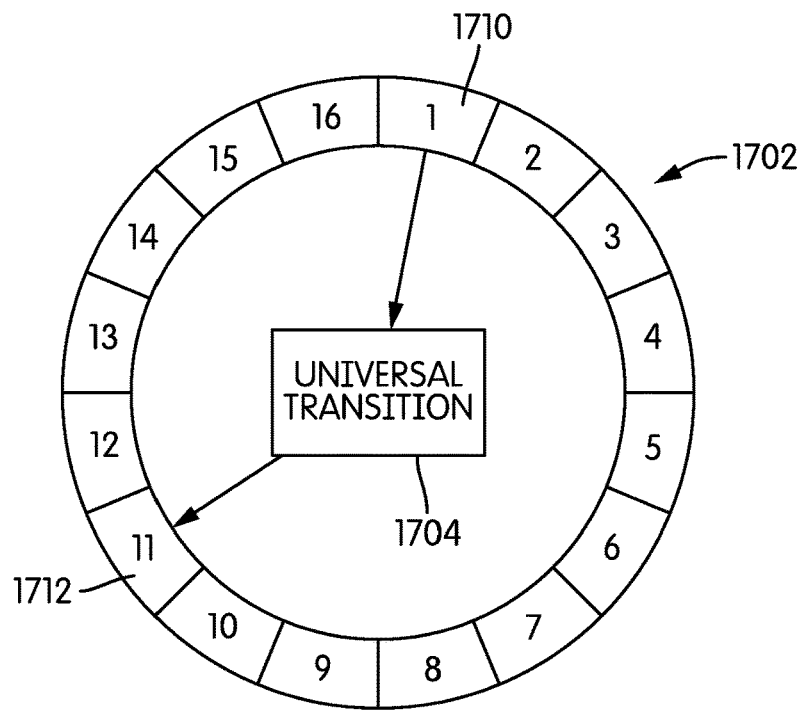
FIG. 17 is a schematic view of an embodiment of a song divided into many segments and a universal transition that provides a direct path between any two segments.
Figure 18:
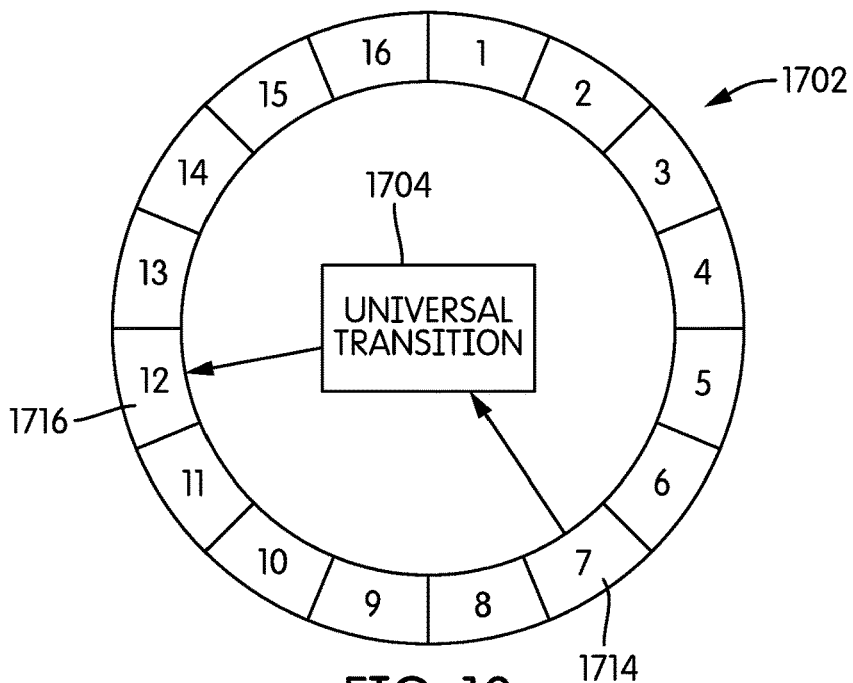
FIG. 18 is a schematic view of an embodiment of a song divided into many segments and a universal transition that provides a direct path between any two segments.

Embodiments can include provisions to facilitate automatically transitioning between segments of different intensities. FIGS. 17 and 18 illustrate schematic views of a song organized as a series of song segments 1702 (in this case, ordered from segment 1 to segment 16). In addition, the embodiment includes a universal transition segment 1704, which acts as a means for connecting any two song segments in a musically coherent way. Thus, in the example of FIG. 17, a composition system 102 can transition from segment 1710 to segment 1712 (corresponding to the 1.sup.st segment and the 11.sup.th segment, respectively) via universal transition segment 1704. Likewise, in the example of FIG. 18, composition system 102 can transition from segment 1714 (the 7.sup.th segment) to segment 1716 (the 12.sup.th segment) by way of universal transition segment 1704.

A universal transition segment can be created in a variety of different ways. In some embodiments, a universal transition segment could be a predetermined musical segment that is designed to have maximum musical compatibility with a variety of possible musical segments. In other embodiments, a universal transition segment could be generated using information from a particular song, thereby ensuring the universal transition segment is maximally compatible with the particular segments of that song. Moreover, a universal transition segment could have any length and tempo, and could include one or more instrumental or voice tracks.

Although the current embodiment illustrates the use of a single universal transition segment, other embodiments could use one, two, or more universal transition segments. Thus, when transitioning between two segments, a composition system could select the best universal transition segment that fits with the two segments from a set of universal transition segments.

While the embodiments discuss playback of music information that has been adjusted according to sensed information and various composition rules, it will be understood that similar principles may likewise apply for systems that record music information for playback at a later time. Thus, a composition system could be used to generate new musical compositions that are stored in one or more types of media, including digital files, CDs, tapes or other kinds of media.

While various embodiments have been described, the description is intended to be exemplary, rather than limiting and it will be apparent to those of ordinary skill in the art that many more embodiments and implementations are possible that are within the scope of the embodiments. Accordingly, the embodiments are not to be restricted except in light of the attached claims and their equivalents. Also, various modifications and changes may be made within the scope of the attached claims.

What is claimed is:

1. A method of adjusting the playback of audio information, comprising:
    playing a song comprising a plurality of song segments that are sequential in time;
    receiving, from at least first sensor, user activity information indicating one or more movements of a user;
    determining, by a processor, a user activity level from the user activity information while a first song segment, of the plurality of song segments, is being played;
    determining, by the processor, a second segment of the song, of the plurality of song segments, comprising a song state that corresponds to the user activity level;
    determining, by the processor, a universal transition segment, wherein the universal transition segment is played in sequence with any of the plurality of song segments to prevent an abrupt musical transition;
    modifying the song to play the universal transition segment after the first song segment; and
    modifying the song to play the second song segment after the universal transition segment.

2. The method according to claim 1, wherein the universal transition segment is generated by analyzing the plurality of song segments.

3. The method according to claim 1, wherein the universal transition segment is configured for use with multiple different songs.

4. The method according to claim 1, wherein the universal transition segment is one of a plurality of universal transition segments, and wherein the method further comprises:
    using two or more universal transition segments, of the plurality of universal transition segments, to transition between the plurality of song segments.

5. The method according to claim 1, further comprising:
    associating a song segment, of the plurality of song segments, with at least a first musical criterion.

6. The method according to claim 5, wherein the first musical criterion comprises at least one of: a key, a pitch, a tempo, a loudness, an intensity.

7. An adaptive music playback system comprising:
    a sensor system that stores user activity information indicating one or more movements of a user; and
    a composition system comprising at least a first computer system, wherein the first computer system comprises a processor and memory storing instructions, wherein the memory, when executed by the processor, causes the composition system to:
    play a song, the song comprising a plurality of song segments and a plurality of audio tracks;
    determine a user activity level based on the user activity information;
    determine a target song intensity corresponding to the user activity level while a first song segment, of the plurality of song segments, is being played; and
    modify a first set of audio tracks, of the plurality of audio tracks, in the first song segment to achieve the target song intensity.

8. The adaptive music playback system of claim 7, wherein the composition system is housed in a portable playback device.

9. The adaptive music playback system of claim 7, wherein the sensor system communicates the user activity information to the composition system in a wireless manner.

10. The adaptive music playback system of claim 7, wherein the user activity information comprises user biometric information.

11. The adaptive music playback system of claim 7, wherein the sensor system is incorporated within at least one of an article of footwear, an item of sporting equipment, or an article of apparel.

12. The adaptive music playback system of claim 7, wherein the composition system determines whether to transition to a second song segment, of the plurality of song segments, by comparing various musical characteristics of the first song segment with the second song segment.

13. The adaptive music playback system of claim 7, wherein the sensor system comprises a plurality of sensors.

14. An adaptive music playback system comprising:
    a sensor system that stores user activity information indicating one or more movements of a user; and
    a composition system comprising at least a first computer system, wherein the first computer system comprises a processor and memory storing instructions, wherein the memory, when executed by the processor, causes the composition system to:

play a song, the song comprising a plurality of song segments and a plurality of audio tracks;

determine a user activity level based on the user activity information;

while a first song segment, of the plurality of song segments, is being played, determine a second song segment comprising a song state that corresponds to the user activity level;

compose, based on a set of composition rules, a musical transition from the first song segment to the second song segment; and modify the song to join the first song segment and the second song segment using the musical transition.

15. The adaptive music playback system of claim 14, wherein the composition system composes the musical transition by determining a sequence of one or more song segments, of the plurality of song segments, to be played prior to playing the second song segment.

16. The adaptive music playback system of claim 14, wherein the composition system retrieves a set of composition rules from the first computer system.

17. The adaptive music playback system of claim 16, wherein the set of composition rules comprise at least a first set of rules that determines which instruments are to be played by the composition system in a song segment.

18. The adaptive music playback system of claim 16, wherein the set of composition rules comprise at least a first set of rules that determines which instruments are to be played together by the composition system.

19. The adaptive music playback system of claim 16, wherein the composition system receives user input adjusting the set of composition rules.

20. The adaptive music playback system of claim 14, the adaptive music playback system further comprising a transducer system.

\* \* \* \* \*